(12) United States Patent
Sabathil et al.

(10) Patent No.: US 9,847,461 B2
(45) Date of Patent: Dec. 19, 2017

(54) OPTOELECTRONIC SEMICONDUCTOR COMPONENT WITH SAPPHIRE FLIP-CHIP

(71) Applicant: OSRAM Opto Semiconductors GmbH, Regensburg (DE)

(72) Inventors: Matthias Sabathil, Regensburg (DE); Stefan Illek, Donaustauf (DE); Thomas Schwarz, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/413,670

(22) PCT Filed: Jul. 18, 2013

(86) PCT No.: PCT/EP2013/065159
§ 371 (c)(1),
(2) Date: Jan. 8, 2015

(87) PCT Pub. No.: WO2014/019861
PCT Pub. Date: Feb. 6, 2014

(65) Prior Publication Data
US 2015/0137162 A1 May 21, 2015

(30) Foreign Application Priority Data

Jul. 30, 2012 (DE) .................. 10 2012 213 343

(51) Int. Cl.
*H01L 33/48* (2010.01)
*H01L 33/54* (2010.01)
(Continued)

(52) U.S. Cl.
CPC .......... *H01L 33/486* (2013.01); *H01L 33/507* (2013.01); *H01L 33/52* (2013.01);
(Continued)

(58) Field of Classification Search
CPC ..... H01L 33/486; H01L 33/58; H01L 33/507; H01L 33/60; H01L 33/52; H01L 33/62; H01L 33/54; H01L 2933/0033; H01L 2933/0041; H01L 2933/0058; H01L 2933/0066; H01L 2924/0002; H01L 2933/005; H01L 33/387; H01L 25/0753
See application file for complete search history.

(56) References Cited

U.S. PATENT DOCUMENTS 6,936,855 B1 * 8/2005 Harrah ............... F21K 9/00
257/59
7,479,662 B2 1/2009 Soules et al.
(Continued)

FOREIGN PATENT DOCUMENTS

| CN | 1836339 A | 9/2006 |
|---|---|---|
| CN | 101150155 A | 3/2008 |

(Continued)

*Primary Examiner* — Ermias Woldegeorgis
(74) *Attorney, Agent, or Firm* — Slater Matsil, LLP (57) ABSTRACT

An optoelectronic semiconductor component has a volume-emitting sapphire flip-chip with an upper side and a lower side. This optoelectronic semiconductor component is embedded in an optically transparent mold body with an upper side and a lower side.

5 Claims, 3 Drawing Sheets (51) Int. Cl.
*H01L 33/62* (2010.01)
*H01L 33/50* (2010.01)
*H01L 33/52* (2010.01)
*H01L 33/58* (2010.01)
*H01L 33/60* (2010.01)
*H01L 25/075* (2006.01)

(52) U.S. Cl.
CPC .............. *H01L 33/54* (2013.01); *H01L 33/58* (2013.01); *H01L 33/60* (2013.01); *H01L 33/62* (2013.01); *H01L 25/0753* (2013.01); *H01L 2924/0002* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(56) References Cited

U.S. PATENT DOCUMENTS

| | | |
|---|---|---|
| 7,714,333 B2 | 5/2010 | Suehiro et al. |
| 8,653,450 B2 | 2/2014 | Wright et al. |
| 8,723,192 B2 | 5/2014 | Weidner et al. |
| 2005/0211997 A1* | 9/2005 | Suehiro .................. H01L 33/20 257/88 |
| 2006/0006404 A1* | 1/2006 | Ibbetson .............. H01L 23/481 257/99 |
| 2006/0012299 A1* | 1/2006 | Suehiro .................. H01L 33/20 313/512 |
| 2008/0284315 A1 | 11/2008 | Tasumi et al. |
| 2009/0050926 A1 | 2/2009 | Suehiro et al. |
| 2009/0061552 A1* | 3/2009 | Chang ................. B29C 45/1671 438/29 |
| 2009/0127702 A1* | 5/2009 | Dekker ................ H01L 21/486 257/713 |
| 2010/0258830 A1* | 10/2010 | Ide ........................ H01L 24/97 257/98 |
| 2011/0001422 A1* | 1/2011 | Aanegola ............ H01L 25/0753 313/501 |
| 2011/0233587 A1 | 9/2011 | Unno |
| 2011/0303940 A1* | 12/2011 | Lee ....................... H01L 33/54 257/98 |
| 2013/0043496 A1 | 2/2013 | Sabathil et al. |
| 2013/0193469 A1 | 8/2013 | Baade et al. |
| 2014/0167092 A1 | 6/2014 | Gärtner et al. |

FOREIGN PATENT DOCUMENTS

| | | |
|---|---|---|
| DE | 102005013264 A1 | 12/2005 |
| DE | 102007022947 A1 | 10/2008 |
| DE | 102009036621 A1 | 2/2011 |
| DE | 102010018260 A1 | 8/2011 |
| DE | 102010031237 A1 | 1/2012 |
| DE | 102011077898 A1 | 12/2012 |
| DE | 102011080458 A1 | 2/2013 |
| EP | 1603170 A1 | 12/2005 |
| WO | 2012007369 A1 | 1/2012 |

* cited by examiner

OPTOELECTRONIC SEMICONDUCTOR COMPONENT WITH SAPPHIRE FLIP-CHIP

This patent application is a national phase filing under section 371 of PCT/EP2013/065159, filed Jul. 18, 2013, which claims the priority of German patent application 10 2012 213 343.7, filed Jul. 30, 2012, each of which is incorporated herein by reference in its entirety.

TECHNICAL FIELD

The present invention relates to an optoelectronic semi-conductor and to a method for producing an optoelectronic semiconductor component.

BACKGROUND

German Patent No. DE 10 2009 036 621 A1, which has a U.S. counterpart published as U.S. Patent Publication No. 2014/0284645 A1, discloses a method for producing an optoelectronic semiconductor component, in which thin-film optoelectronic semiconductor chips are arranged on an upper side of a carrier. An opaque mold body is cast around the optoelectronic semiconductor chips, and covers all side surfaces of the optoelectronic semiconductor chips. Upper and lower sides of the optoelectronic semiconductor chips preferably remain free. After removal of the carrier, the optoelectronic semiconductor chips may be divided up. Contact positions may be provided on the upper and/or lower sides of each semiconductor chip. The mold body may, for example, consist of a molding material based on an epoxy.

Optoelectronic semiconductor chips formed as sapphire flip-chips, which emit radiation not just through one surface of the chip but in all directions as volume emitters, are furthermore known from the prior art. Such sapphire flip-chips generally have electrical contacts on only one of their surfaces.

SUMMARY

Embodiments of the present invention provide an improved optoelectronic semiconductor component. Further embodiments of the present invention specify an improved method for producing an optoelectronic semiconductor component.

An optoelectronic semiconductor component has a volume-emitting sapphire flip-chip with an upper side and a lower side, which is embedded in an optically transparent mold body with an upper side and a lower side. Advantageously, the mold body may then be used as a compact housing of the optoelectronic semiconductor component and is transmissive for the radiation emitted by the sapphire flip-chip. Advantageously, a multiplicity of volume-emitting sapphire flip-chips may be embedded simultaneously in a common mold body, which is subsequently subdivided in order to obtain a multiplicity of optoelectronic semiconductor components. In this way, the optoelectronic semiconductor component can be produced very economically.

In one embodiment of the optoelectronic semiconductor component, the lower side of the chip is not covered by the mold body. Advantageously, the chip can then be electrically contacted on its lower side.

In one embodiment of the optoelectronic semiconductor component, converter particles are integrated into the mold body, and are intended to convert a wavelength of radiation emitted by the chip. Advantageously, the mold body is then not only used as a housing of the optoelectronic semiconductor component, but simultaneously fulfills the function of light conversion. This advantageously leads to a particularly economical and compact optoelectronic semiconductor component.

In one embodiment of the optoelectronic semiconductor component, a reflective layer is arranged on the lower side of the mold body. Advantageously, the reflective layer may then reflect radiation emitted in the direction of the lower side of the mold body by the sapphire flip-chip in the direction of the upper side of the mold body, so that the used part of the light flux of the optoelectronic semiconductor component is increased.

In one refinement of the optoelectronic semiconductor component, the upper side of the mold body is convexly shaped. Advantageously, the mold body is then not only used as a housing of the optoelectronic semiconductor component, but simultaneously formed as primary optics for light shaping and/or color locus control. Advantageously, this leads to a particularly economical and compact optoelectronic semiconductor component.

In one embodiment of the optoelectronic semiconductor component, the chip has on its lower side a multiplicity of first electrical contacts of a first polarity and a multiplicity of second electrical contacts of a second polarity. In this case, the semiconductor component has an electrically conductive interconnection layer which conductively connects the first contacts to one another and conductively connects the second contacts to one another. Advantageously, the sapphire flip-chip may then be formed without its own interconnection, so that the sapphire flip-chip can be obtained economically. The interconnection layer of the optoelectronic semiconductor component may advantageously be produced economically and with little outlay for a multiplicity of optoelectronic semiconductor components.

In one embodiment of the optoelectronic semiconductor component, the semiconductor component has a multiplicity of chips, which are embedded together in the mold body. In this case, the chips are connected in series by the interconnection layer. Advantageously, such a multi-chip arrangement has a particularly favorable ratio between the size of the individual chips and the total size of the optoelectronic semiconductor component. In particular, the relative space requirement of the interconnection layer decreases with an increasing number of chips contained in the optoelectronic semiconductor component.

In one embodiment of the optoelectronic semiconductor component, the mold body has an opening, wherein a first contact surface electrically conductively connected to the first contacts is accessible through the opening. Advantageously, the optoelectronic semiconductor component can then be electrically contacted from its upper side. In this way, it is advantageously possible to avoid the provision of electrical contacts for the optoelectronic semiconductor component on the lower side of the optoelectronic semiconductor component.

In another embodiment of the optoelectronic semiconductor component, it is formed as an SMD component with two solderable electrical connection surfaces arranged on a lower side of the semiconductor component. Advantageously, the semiconductor component is then suitable for SMD mounting by means of reflow soldering.

In one embodiment of the optoelectronic semiconductor component, the mold body is filled with an inorganic filler. Here, the fill factor is more than 80%. Advantageously, the filled body then has a low thermal expansion coefficient, which is matched to the thermal expansion coefficient of the sapphire flip-chip.

A method for producing an optoelectronic semiconductor component comprises steps for providing a volume-emitting sapphire flip-chip with an upper side and a lower side, and for embedding the chip in an optically transparent mold body with an upper side and a lower side. Advantageously, with this method it is possible to produce an economical optoelectronic semiconductor component, the mold body of which is used as a housing for mechanical connection of the parts of the optoelectronic semiconductor component and is transmissive for radiation emitted by the volume-emitting sapphire flip-chip.

In one embodiment of the method, the lower side of the chip is arranged on a film before the chip is embedded. Advantageously, the mold body may then be produced by film-assisted transfer molding. In this case, the lower side of the chip is advantageously not covered by the mold body and can thus be used for electrical contacting of the chip.

In one embodiment of the method, a further step for removing a part of the mold body on the upper side of the mold body is carried out after the embedding of the chip. Advantageously, the upper side of the mold body can thereby be structured in such a way that the mold body forms primary optics of the optoelectronic semiconductor component.

In one refinement of the method, a further step for applying a reflective layer onto the lower side of the mold body is carried out after the embedding of the chip in the mold body. Advantageously, the applied reflective layer may be used to reflect radiation emitted in the direction of the lower side of the mold body by the chip. In this way, the optoelectronic semiconductor component which can be obtained by the method has a higher effectively usable light flux.

In one embodiment of the method, a multiplicity of sapphire flip-chips are embedded simultaneously in a common mold body. This advantageously reduces the production outlay required per sapphire flip-chip.

In one embodiment of the method, the common mold body is separated in a subsequent method step. Advantageously, the method then allows simultaneous common production of a multiplicity of optoelectronic semiconductor components, so that the production costs per optoelectronic semiconductor component are drastically reduced.

BRIEF DESCRIPTION OF THE DRAWINGS

The above-described properties, features and advantages of this invention, as well as the way in which they are achieved, will be more clearly and comprehensively understandable in conjunction with the following description of the exemplary embodiments, which will be explained in more detail in connection with the drawings. In a respectively highly schematized representation.

DETAILED DESCRIPTION OF ILLUSTRATIVE EMBODIMENTS

Figure 1:
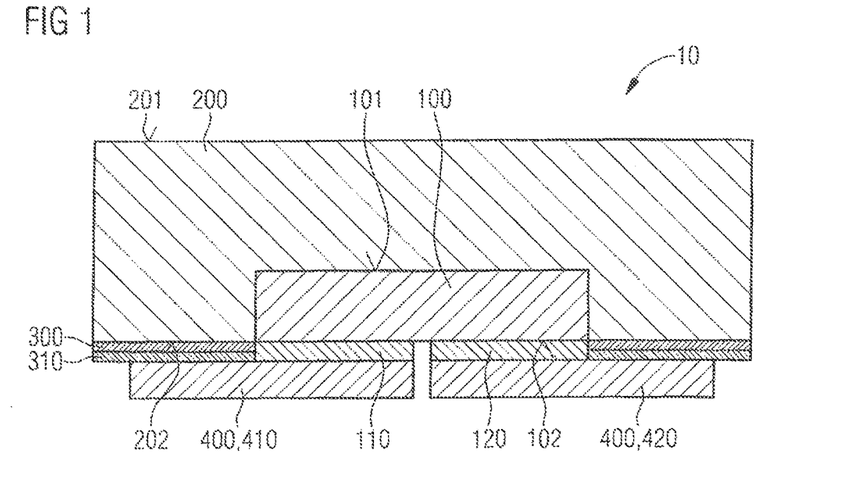
FIG. 1 shows a section through an optoelectronic semiconductor component according to a first embodiment.
Figure 2:
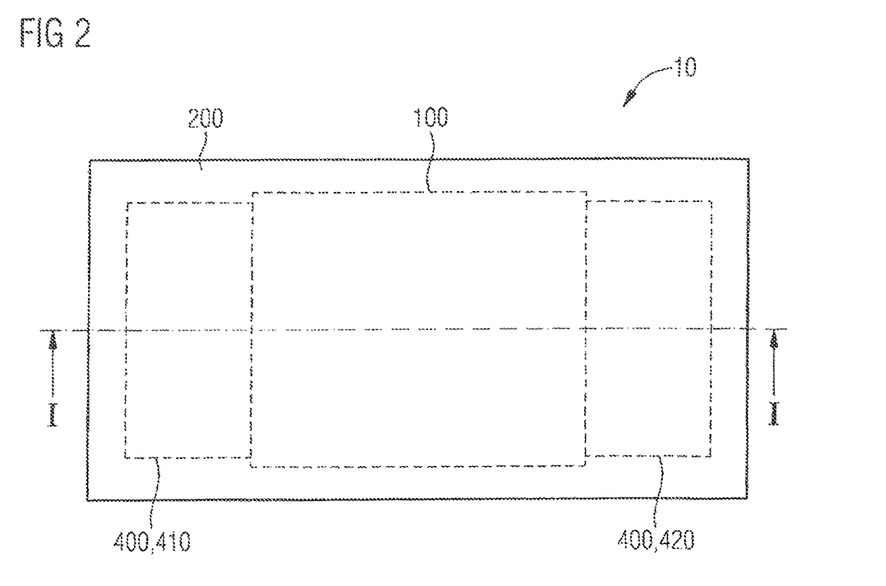
FIG. 2 shows a partially transparent view through the optoelectronic semiconductor component of the first embodiment.

FIG. 1 shows a highly schematized representation of a section through an optoelectronic semiconductor component 10 according to a first embodiment. FIG. 2 shows a highly schematized representation of a plan view of the optoelectronic semiconductor component 10. In the representation of FIG. 2, some parts of the optoelectronic semiconductor component 10 are represented partially transparently for the purpose of better understanding. The section line along which the optoelectronic semiconductor component 10 is sectioned in the representation of FIG. 1 is indicated in FIG. 2. The optoelectronic semiconductor component 10 may, for example, be an LED package.

The optoelectronic semiconductor component 10 comprises a chip 100. The chip 100 has an upper side 101, and a lower side 102 opposite the upper side 101. A thickness of the chip 100 between the upper side 101 and the lower side 102 may, for example, be between 100 µm and 200 µm. The chip 100 is formed as a sapphire flip-chip with interconnection integrated into the sapphire flip-chip. The chip 100 is formed as a volume emitter in order to emit optical radiation in all spatial directions. The chip 100 preferably has a sapphire substrate adjacent to the upper side 101, and an epitaxial layer, grown epitaxially onto the sapphire substrate, which is oriented toward the lower side 102 and comprises a light-generating active layer.

A first electrical contact 110 and a second electrical contact 120 are arranged on the lower side 102 of the chip 100. The first electrical contact 110 and the second electrical contact 120 are externally accessible electrical contacts of the internal interconnection of the chip 100. When an electric voltage is applied between the first electrical contact 110 and the second electrical contact 120, the chip 100 emits electromagnetic radiation, for example, visible light. The electromagnetic radiation is emitted by the chip 100 in all spatial directions. Radiation emitted in the direction of the lower side 102 of the chip 100, however, is at least partially reflected in the direction of the upper side 101 of the chip 100 by the electrical contacts 110, 120 arranged on the lower side 102.

The chip 100 of the optoelectronic semiconductor component 10 is embedded in a mold body 200. The mold body 200 has an upper side 201 and a lower side 202. The lower side 102 of the chip 100 is not covered by the mold body 200. The lower side 102 of the chip 100 therefore ends approximately flush with the lower side 202 of the mold body 200. All other surfaces of the chip 100 are preferably covered by the mold body 200.

The mold body 200 comprises a material which is essentially transparent for the radiation emitted by the chip 100. For example, the mold body 200 may comprise a transparent injection molding material (mold material). The mold body 200 preferably comprises a silicone mold material, for example, a silicone resin.

The material of the mold body 200 preferably has a thermal expansion coefficient which is matched to the thermal expansion coefficient of the chip 100, i.e., it approximately corresponds thereto. Preferably, the mold body 200 has a thermal expansion coefficient of at most 8 ppm/K. This may, for example, be achieved by filling the material of the mold body 200 with µm or nm scale inorganic fillers. For example, the material of the mold body 200 may be filled with quartz. The fill factor is in this case preferably more than 80%. As an alternative, it is conceivable to use ormocers. Advantageously, the high fill factor simultaneously leads to a high thermal conductivity of the mold body 200. In this way, the mold body 200 can effectively dissipate heat produced by the chip 100.

The material of the mold body 200 is furthermore preferably aging-resistant for blue light under the effect of heat.

Converter particles, which are used in order to convert the wavelength of the radiation emitted by the chip 100, may furthermore be integrated into the mold body 200. The converter particles may, for example, comprise phosphorus. If the mold body 200 contains such converter particles, then the converter particles absorb a part of the radiation emitted by the chip 100 and in turn emit radiation with a different wavelength. In the scope of the present description, a mold body 200 having such converter particles is nevertheless considered and referred to as transparent.

The mold body 200 is preferably produced from a molding compound by an injection molding or injection-compression molding process. Advantageously, a top-foil molding system is not necessary for this, since the upper side 101 of the chip 100 does not need to be protected; rather, the mold body 200 is molded over it. In this way, the mold body 200 can be produced by a simple and economical process.

The upper side 201 of the mold body 200 in the optoelectronic semiconductor component 10 is formed so as to be planar and parallel to the lower side 202. It would, however, also be possible to form the upper side 201 of the mold body 200 other than as a plane. For example, the upper side 201 of the mold body 200 could have a convex lens shape in order to influence the spatial distribution of the radiation emitted by the chip 100. If the mold body 200 has integrated converter particles, then color locus control is also possible by shaping the upper side 201 of the mold body 200. Shaping of the upper side 201 of the mold body 200 either may be carried out already during production of the mold body 200 by a suitable molding tool, or it may result from subsequent processing of the upper side 201 of the mold body 200. Subsequent processing of the upper side 201 of the mold body 200 may, for example, be carried out by laser ablation or by selective grinding.

A reflective layer 300 is arranged on the lower side 202 of the mold body 200. A reflective layer 300 may, for example, be a metallic layer, for instance a silver layer. The reflective layer 300 is used to reflect radiation emitted in the direction of the lower side 202 of the mold body 200 by the chip 100 in the direction of the upper side 201 of the mold body 200. In this way, radiation emitted in the direction of the lower side 202 of the mold body 200 is not lost when the optoelectronic semiconductor component 10 is arranged on a carrier. Thus, the effective light flux of the optoelectronic semiconductor component 10 is increased.

A first dielectric layer 310 is arranged on the reflective layer 300. The reflective layer 300 is therefore located between the mold body 200 and the first dielectric layer 310. The first dielectric layer 310 may comprise an organic or inorganic material. For example, the first dielectric layer 310 may comprise silicon dioxide and have a thickness of 0.5 μm.

In the region of the lower side 102 of the chip 100, the reflective layer 300 and the first dielectric layer 310 have a hole. The lower side 102 of the chip 100 is therefore not covered by the reflective layer 300 and the first dielectric layer 310.

An electroplated layer 400 is arranged on the lower side 202 of the mold body 200 and the lower side 102 of the chip 100. The electroplated layer 400 comprises an electrically conductive material, for example, copper, and has preferably been applied by electrodeposition. The electroplated layer 400 may, for example, have a thickness of 100 μm. The electroplated layer 400 is electrically insulated from the reflective layer 300 by the first dielectric layer 310.

The electroplated layer 400 comprises a first electrical solder contact 410 and a second electrical solder contact 420. The first electrical solder contact 410 and the second electrical solder contact 420 are electrically insulated from one another. The first electrical solder contact 410 is in electrically conductive connection with the first electrical contact 110 on the lower side 102 of the chip 100. The second electrical solder contact 420 is in electrically conductive connection with the second electrical contact 120 on the lower side 102 of the chip 100.

The electrical solder contact 410, 420 may be used for electrical contacting of the optoelectronic semiconductor component 10 by means of a reflow solder method. The optoelectronic semiconductor component 10 is therefore an SMD-compatible component.

At the same time, the electrical solder contacts 410, 420 are used to dissipate heat from the optoelectronic semiconductor component 10. The waste heat produced by the chip 100 in this case flows out of the chip through the electrical contacts 110, 120 and the electrical solder contacts 410, 420 of the optoelectronic semiconductor component 10. A smaller part of the waste heat produced by the chip 100 also flows away through the mold body 200, the reflective layer 300 and the first dielectric layer 310.

Figure 3:
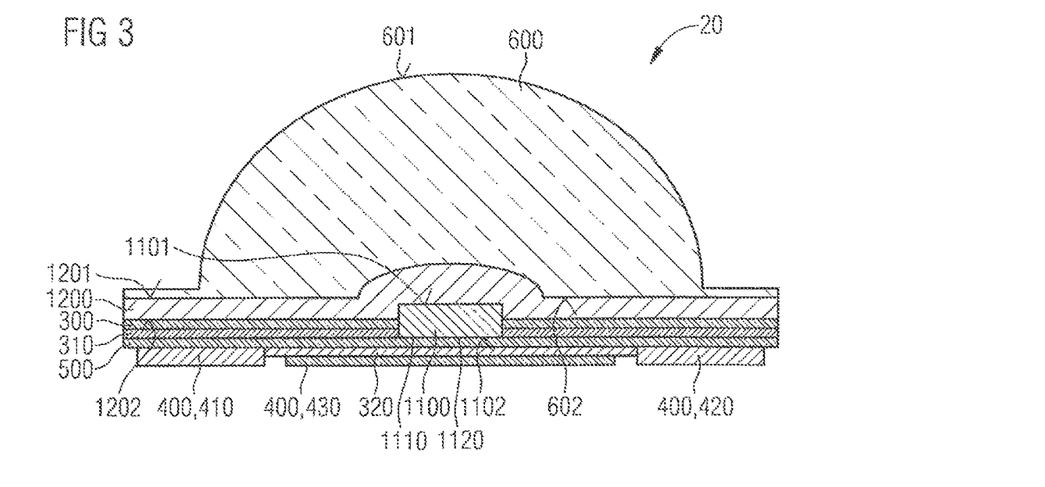
FIG. 3 shows a section through an optoelectronic semiconductor component according to a second embodiment.
Figure 4:
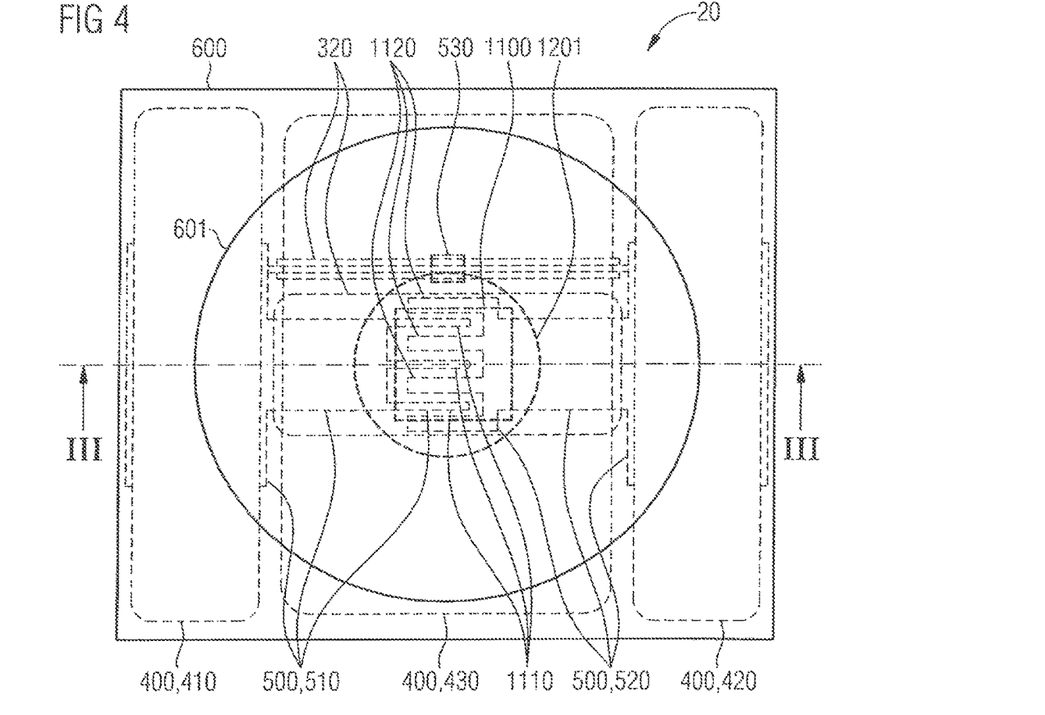
FIG. 4 shows a partially transparent view of the optoelectronic semiconductor component of the second embodiment.

FIG. 3 shows a highly schematized representation of a section through an optoelectronic semiconductor component 20 according to a second embodiment. FIG. 4 shows a plan view of, or partially transparent view through, the optoelectronic semiconductor component 20. The section edge on which the optoelectronic semiconductor component 20 is sectioned in the representation of FIG. 3 is shown in FIG. 4. The optoelectronic semiconductor component 20 has correspondences with the optoelectronic semiconductor component of FIGS. 1 and 2. Parts which are the same and have the same effect are therefore provided with the same references and will not be described in detail again.

Instead of the chip 100 of the optoelectronic semiconductor component 10, the optoelectronic semiconductor component 20 has a chip 1100. The chip 1100 is likewise formed as a sapphire flip-chip, but it does not have integrated interconnection. The chip 1100 is also a volume emitter, which emits electromagnetic radiation from all regions of the chip 1100 in all spatial directions. The chip 1100 has an upper side 1101, and a lower side 1102 opposite the upper side 1101. The thickness of the chip 1100 may correspond to that of the chip 100.

A multiplicity of electrical contacts 1110 of a first polarity and a multiplicity of electrical contacts 1120 of a second polarity are arranged on the lower side 1102 of the chip 1100. The electrical contacts 1110, 1120 are respectively distributed in a regular arrangement over the entire lower side 1102 of the chip 1100. When an electric voltage is applied between the electrical contacts 1110 of the first polarity and the electrical contacts 1120 of the second polarity, the chip 1110 emits electromagnetic radiation, for example, visible light.

The chip 1100 of the optoelectronic semiconductor component 20 is embedded in a mold body 1200. The mold body 1200 has an upper side 1201 and a lower side 1202. The lower side 1102 of the chip 1100 is not covered by the mold body 1200 and preferably ends approximately flush with the lower side 1202 of the mold body 1200. All of the remaining surfaces of the chip 1100 are preferably covered by the mold body 1200.

The mold body 1200 comprises the same material as the mold body 200 of the optoelectronic semiconductor component 10, and it has the same function. In particular, converter particles for converting the radiation emitted by the chip 1100 may also be integrated into the mold body 1200. The production of the mold body 1200 may also be carried out in a similar way to the production of the mold body 200.

The upper side 1201 one of the mold body 1200 has a convex section, which is arranged above the upper side 1101 of the chip 1100 and forms primary optics of the optoelectronic semiconductor component 20. The angular distribution of the radiation emitted by the chip 1100 is influenced by the convex upper side 1201 of the mold body 1200. The convex section of the upper side 1201 of the mold body 1200 may already be produced during the injection molding of the mold body 1200 by a suitable molding tool, or it may be produced by subsequent processing of the upper side 1201 of the mold body 1200. In a simplified embodiment of the optoelectronic semiconductor component 20, the upper side 1201 of the mold body 1200 may also be formed so as to be planar.

An optical lens 600 having an upper side 601 and a lower side 602 is arranged on the upper side 1201 of the mold body 1200. The lower side 602 of the optical lens 600 is in contact with the upper side 1201 of the mold body 1200. The optical lens 600 comprises a material which is transparent for the radiation emitted by the chip 1100. The optical lens 600 is preferably molded onto the mold body 1200 during production of the optoelectronic semiconductor component 20. The optical lens 600 is used for further beam shaping of the radiation emitted by the chip 1100. To this end, the upper side 601 of the optical lens 600 is formed with a convex lens shape. In the example represented in FIGS. 3 and 4, the convex region of the upper side 601 of the optical lens 600 has a larger radius than the convex region of the upper side 1201 of the mold body 1200. The convex regions of the upper side 601 of the optical lens 600 and of the upper side 1201 of the mold body 1200 may, however, also be formed in another way. In a simplified embodiment of the optoelectronic semiconductor component 20, the optical lens 600 may also be omitted.

A reflective layer 300 and a first dielectric layer 310, which correspond in structure and function to the corresponding layers of the optoelectronic semiconductor component 10, are in turn arranged on the lower side 1202 of the mold body 1200.

In the optoelectronic semiconductor component 20, an interconnection layer 500 made of an electrically conductive material is arranged on the first dielectric layer 310. The interconnection layer 500 may, for example, comprise copper and have a thickness of 2 µm. The interconnection layer 500 is electrically insulated from the reflective layer 300 by the first dielectric layer 310.

The interconnection layer 500 has a first manifold 510 and a second manifold 520, each of which are formed by mutually separated lateral sections of the interconnection layer 500. The first manifold 510 and the second manifold 520 are therefore electrically insulated from one another. The first manifold 510 is in electrically conductive connection on the lower side 1102 of the chip 1100 with all electrical contacts 1110 of the first polarity. The second manifold 520 is in electrically conductive connection with all electrical contacts 1120 of the second polarity on the lower side 1102 of the chip 1100. The manifolds 510, 520 are used to electrically connect the electrical contacts 1110, 1120 of a respective polarity to one another. Furthermore, the manifolds 510, 520 are used to feed out electrically conductive connections to the electrical contacts 1110, 1120 of the chip 1100 in the lateral direction.

Parts of the interconnection layer 500 are covered by a second dielectric layer 320. The second dielectric layer 320 comprises an electrically insulating material, for example, the same material as the first dielectric layer 310. The second dielectric layer 320 may however comprise an organic material filled with ceramic particles, for example, the commercially available product Bergquist HPL. In this case, the second dielectric layer 320 has a particularly good thermal conductivity.

The optoelectronic semiconductor component 20 furthermore has an electroplated layer 400, which corresponds essentially to the electroplated layer 400 of the optoelectronic semiconductor component 10 of FIGS. 1 and 2. The electroplated layer 400 comprises a first electrical solder contact 410, a second electrical solder contact 420 and a thermal solder contact 430. The first electrical solder contact 410 is partially arranged on the first manifold 510 of the interconnection layer 500, and therefore provides an electrically conductive connection to the electrical contacts 1110 of the first polarity of the chip 1100. The second electrical solder contact 420 is partially arranged on the second manifold 520 of the interconnection layer 500, and therefore provides an electrically conductive connection to the electrical contacts 1120 of the second polarity of the chip 1100. The thermal solder contact 430 is arranged on the second dielectric layer 320 and on the first dielectric layer 310, and is electrically insulated from the interconnection layer 500 by the second dielectric layer 320. The thermal solder contact 430 is used to dissipate waste heat produced by the chip 1100.

The electrical solder contacts 410, 420 and the thermal solder contact 430 are suitable for being contacted by means of a reflow solder method. The optoelectronic semiconductor component 20 is therefore also formed as an SMD component.

The optoelectronic semiconductor component 20 furthermore has a protective diode 530, which is electrically conductively connected to the first manifold 510 and to the second manifold 520. The protective diode 530 is embedded together with the chip 1100 in the mold body 1200. The protective diode 530 is used as an ESD protective diode for protecting the chip 1100 against damage by static discharges.

The mold body 1200 of the optoelectronic semiconductor component 20 is therefore used as a housing and for mechanical connection of the parts of the optoelectronic semiconductor component 20, and optionally for light conversion and light shaping.

Figure 5:
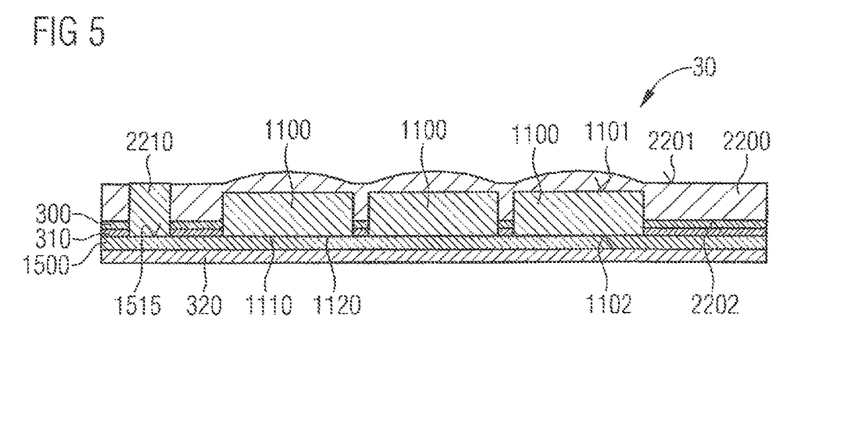
FIG. 5 shows a section through an optoelectronic semiconductor component according to a third embodiment.
Figure 6:
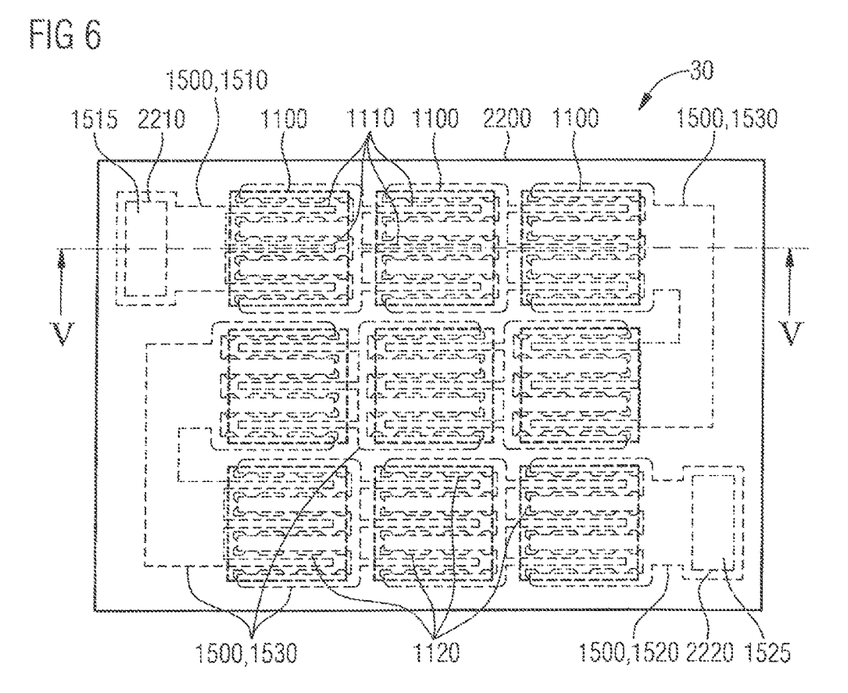
FIG. 6 shows a partially transparent view of the optoelectronic semiconductor component of the third embodiment.

FIG. 5 shows a highly schematized representation of a section through an optoelectronic semiconductor component 30 according to a third embodiment. FIG. 6 shows a plan view of, or partially transparent view through, the optoelectronic semiconductor component 30. The section line along which the optoelectronic semiconductor component 30 is sectioned in the representation of FIG. 5 is indicated in FIG. 6. The optoelectronic semiconductor component 30 has correspondences with the optoelectronic semiconductor component 20 of FIGS. 3 and 4. Parts which are the same and have the same effect are therefore provided with the same references and will not be described in detail again.

The optoelectronic semiconductor component 30 comprises a total of nine chips 1100. The chips 1100 are arranged in a matrix of 3×3 chips 1100. In this way, the ratio of the area of the chips 1100 to the total lateral extent of the optoelectronic semiconductor component 30 is greater in the optoelectronic semiconductor component 30 than in the optoelectronic semiconductor component 20. If the lateral extent of the chips 1100 is, for example, 1 mm×1 mm, and the lateral extent of the optoelectronic semiconductor component 30 is, for example, 4 mm×4 mm, then a fraction of 56% of the area of the optoelectronic semiconductor component 30 is formed by the upper sides 1101 of the chips 1100. If the lateral extent of the optoelectronic semiconductor component 20 of FIGS. 3 and 4 is, for example, 3 mm×3 mm, then only a fraction of 11% of the area of the optoelectronic semiconductor component 20 is formed by the upper side 1101 of the chip 1100 in the optoelectronic semiconductor component 20. The optoelectronic semiconductor component 30 may, in alternative embodiments, also have a different number of chips 1100, for example, 2×2 chips 1100 or 3×4 chips 1100.

The chips 1100 of the optoelectronic semiconductor component 30 are embedded in a common mold body 2200. The mold body 2200 has an upper side 2201 and a lower side 2202. The lower sides 1102 of the chips 1100 are not covered by the mold body 2200, and preferably end approximately flush with the lower side 2202 of the mold body 2200. The composition and the method used for the production of the mold body 2200 correspond to those of the mold body 1200 of the optoelectronic semiconductor component 20.

In the example represented, the upper side 2201 of the mold body 2200 has a plurality of convex lens-shaped sections, which are respectively arranged over the upper sides 1101 of the chips 1100. In alternative embodiments, the upper side 2201 of the mold body 2200 could also have merely one convex region, which covers all nine chips 1100, or the upper side 2201 of the mold body 2200 could be formed so as to be planar. Other configurations of the upper side 2201 of the mold body 2200 are also possible.

A reflective layer 300 and a first dielectric layer 310, the structure and function of which correspond to the same layers of the optoelectronic semiconductor components 10 and 20, are in turn arranged on the lower side 2202 of the mold body 2200 of the optoelectronic semiconductor component 30. The lower sides 1102 of the chips 1100 are not covered by the reflective layer 300 and the first dielectric layer 310.

In the optoelectronic semiconductor component 30, an interconnection layer 1500 made of an electrically conductive material is arranged on the first dielectric layer 310. The interconnection layer 1500 is electrically separated from the reflective layer 300 by the first dielectric layer 310. The interconnection layer 1500 comprises a first manifold 1510, a second manifold 1520 and a plurality of series circuit sections 1530 in different lateral sections. The manifolds 1510, 1520 and the series circuit sections 1530 are respectively separated from one another laterally and therefore electrically insulated from one another.

The first manifold 1510 is electrically conductively connected to the electrical contacts 1110 of the first polarity of a first chip 1100. The second manifold 1520 is electrically conductively connected to the electrical contacts 1120 of the second polarity of a last of the chips 1100. The series circuit sections 1530 respectively connect the electrical contacts 1120 of the second polarity of one of the chips 1100 to the electrical contacts 1120 of the first polarity of a subsequent chip 1100. In this way, the nine chips 1100 of the optoelectronic semiconductor component 30 are electrically connected in series by the series circuit sections 1530. By applying an electric voltage between the first manifold 1510 and the second manifold 1520, a flow of electric current through all nine chips 1100 of the optoelectronic semiconductor component 30 can be induced, the effect of which is that the chips 1100 emit electromagnetic radiation.

A second dielectric layer 320, which electrically insulates the interconnection layer 1500 from the environment of the optoelectronic semiconductor component 30, is arranged on the interconnection layer 1500. An electroplated layer 400 with a thermal solder contact 430, which is used to dissipate waste heat produced by the chips 1100, could in turn be arranged on the second dielectric layer 320. In the embodiment of the optoelectronic semiconductor component 30 as represented, the electroplated layer 400 is omitted. In this embodiment, therefore, structuring of the second dielectric layer 320 may also be omitted.

The mold body 2200 has a first opening 2210 and a second opening 2220. The first opening 2210 and the second opening 2220 respectively extend from the upper side 2201 to the lower side 2202 of the mold body 2200. In the region of the openings 2210, 2220, holes are furthermore formed in the reflective layer 300 and the first dielectric layer 310. The first opening 2210 is arranged laterally above the first manifold 1510. The second opening 2220 is arranged laterally above the second manifold 1520. A first contact surface 1515 of the first manifold 1510 is therefore accessible through the first opening 2210 from the upper side 2201 of the mold body 2200. A second contact surface 1525 of the second manifold 1520 is accessible through the second opening 2220 from the upper side 2201 of the mold body 2200.

The first contact surface 1515 of the optoelectronic semiconductor component 30 may, for example, be electrically contacted by wire bonding from the upper side 2201 of the mold body 2200. Correspondingly, the second contact surface 1525 may also be electrically contacted through the second opening 2220 from the upper side 2201 of the mold body 2200. The optoelectronic semiconductor component 30 is thus not an SMD component, but a component contactable from above.

The production of the optoelectronic semiconductor components 10, 20, 30 is preferably carried out as explained below. First, the chips 100, 1100 are arranged with their lower sides 1102 on a film. The chips 100, 1100 are subsequently embedded in the mold bodies 200, 1200, 2200 by a molding process. The upper sides 201, 1201, 2201 of the mold bodies 200, 1200, 2200 may be formed so as to be planar, or already be provided with convex lens sections, or sections configured in a different way, during the molding process by using suitable molding tools. As an alternative, processing of the upper sides 201, 1201, 2201 of mold bodies 200, 1200, 2200 may also be carried out after the molding process, for example, by laser ablation or selective grinding. Additional optical lenses 600 may subsequently be arranged on the upper sides 201, 1201, 2201 of the mold bodies 200, 1200, 2200, for example, by molding these lenses 600 on.

The reflective layer 300, the first dielectric layer 310, and optionally the second dielectric layer 320, are subsequently applied onto the lower sides 202, 1202, 2202 of the mold bodies 200, 1200, 2200 and structured. The electrical contacting of the optoelectronic semiconductor components 10, 20, 30 may be carried out via solder contacts 410, 420 of an electroplated layer 400, or through openings 2210, 2220 in the mold bodies 200, 1200, 2200. A combination of the two possibilities may even be envisioned. If an electroplated layer 400 is provided, this may also use a thermal contact 430 for dissipating waste heat produced by the chips 100, 1100.

A protective diode 530 may respectively be integrated into the optoelectronic semiconductor components 10, 20, 30. The protective diode 530 is preferably embedded together with the chips 100, 1100 in the mold bodies 200, 1200, 2200.

Particularly preferably, a plurality of optoelectronic semiconductor components 10, 20, 30 of one type or of different types are produced simultaneously by embedding a multiplicity of chips 100, 1100 simultaneously in a large common mold body, for example, in a mold body in the form of a molding wafer. After the application and structuring of the further layers 300, 310, 320, 400, the large common mold body is subdivided into smaller mold bodies 200, 1200, 2200 in order to obtain a multiplicity of optoelectronic semiconductor components 10, 20, 30.

The invention has been illustrated and described in detail with the aid of preferred exemplary embodiments. The invention is not, however, restricted to the examples disclosed. Rather, other variants may be derived therefrom by the person skilled in the art, without departing from the protective scope of the invention.

The invention claimed is:

1. A method for producing an optoelectronic semiconductor component, the method comprising:
   providing a volume-emitting sapphire flip-chip with an upper side and a lower side;
   embedding the chip in an optically transparent mold body with an upper side and a lower side;
   arranging two solderable electrical connection surfaces on a lower side of the semiconductor component; and
   after embedding the chip in the mold body, applying a reflective layer onto the lower side of the mold body.

2. The method as claimed in claim 1, wherein the lower side of the chip is arranged on a film before the chip is embedded.

3. The method as claimed in claim 1, further comprising after embedding the chip, removing a part of the mold body on the upper side of the mold body.

4. The method as claimed in claim 1, wherein embedding the chip comprises embedding a plurality of sapphire flip-chips simultaneously in a common mold body.

5. The method as claimed in claim 4, further comprising separating the common mold body after the chips are embedded.

* * * * *